US008094827B2

(12) United States Patent
Baba et al.

(10) Patent No.: US 8,094,827 B2
(45) Date of Patent: Jan. 10, 2012

(54) SOUND REPRODUCING APPARATUS AND SOUND REPRODUCING SYSTEM

(75) Inventors: Teruo Baba, Tsurugashima (JP); Yoshiki Ohta, Tsurugashima (JP); Takashi Mitsuhashi, Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 1392 days.

(21) Appl. No.: 11/632,963

(22) PCT Filed: Jul. 13, 2005

(86) PCT No.: PCT/JP2005/012902

§ 371 (c)(1),
(2), (4) Date: Jan. 19, 2007

(87) PCT Pub. No.: WO2006/009028

PCT Pub. Date: Jan. 26, 2006

(65) Prior Publication Data

US 2008/0089522 A1 Apr. 17, 2008

(30) Foreign Application Priority Data

Jul. 20, 2004 (JP) ................................ 2004-211843

(51) Int. Cl.
*H03G 3/00* (2006.01)
*H04R 29/00* (2006.01)
*H04B 1/00* (2006.01)

(52) U.S. Cl. ............................... 381/63; 381/56; 381/86

(58) Field of Classification Search .................... 381/56, 381/66, 86, 63
See application file for complete search history.

(56) References Cited

U.S. PATENT DOCUMENTS 5,953,432 A * 9/1999 Yanagawa et al. ............ 381/335
6,169,806 B1 * 1/2001 Kimura et al. .................. 381/17
2001/0016047 A1 8/2001 Ohta
2003/0121403 A1 7/2003 Miyagishima et al.

FOREIGN PATENT DOCUMENTS

JP 2610991 B2 2/1997
JP 2000-181462 A 6/2000
JP 2001-224092 A 8/2001
JP 2003-506984 A 2/2003
JP 2003-195859 A 7/2003
WO WO 01/11918 A2 2/2001

* cited by examiner

*Primary Examiner* — Vivian Chin
*Assistant Examiner* — Douglas Suthers
(74) *Attorney, Agent, or Firm* — Sughrue Mion, PLLC

(57) ABSTRACT

The present invention provides a sound reproducing system and a sound reproducing apparatus that can provide a high realistic sensation to a user, without having to do a troublesome task on the user's side.

A surround-sound system (100) includes: an array speaker system (20) that is formed with speaker units SPU having the same characteristics; and a signal processing apparatus (120) that drives the speaker units SPU independently of one another and amplifies an audio signal. The signal processing apparatus (120) includes: a signal processing control unit (260) that calculates each filter coefficient for each of the speaker units so as to generate reverberant components to be reflected by a wall surface of a listening room (10) when the audio signal or test signal is amplified through the array speaker system (20) based on preset reverberant characteristics; and a filtering unit (250) that divides the audio signal or test signal by the same number as the number of speaker units so as to obtain unit signals, and then performs signal processing on each of the unit signals divided based on each of the filter coefficients.

8 Claims, 12 Drawing Sheets

SOUND REPRODUCING APPARATUS AND SOUND REPRODUCING SYSTEM

The entire disclosure of the Japanese Patent Application No. 2004-211843 filed on Jul. 20, 2004 and including the specification, the claims, the drawings and the abstract is incorporated herein by reference in its entirety.

FIELD OF THE INVENTION

The present invention relates to the technical field of sound reproducing apparatuses and sound reproducing systems that can provide higher realistic sensation to users through array speakers.

BACKGROUND OF THE INVENTION

In recent years, surround-sound systems for amplifying the sounds of human voices, music and the like have been put into practical use. Each of those surround-sound systems has a plurality of speakers including a center speaker, left and right front speakers and left and right rear speakers each having a specific function of reproducing sounds such as adding reverberant sound and changing the frequency characteristics.

As a typical surround-sound system, a 5.1 ch (channel) surround-sound system of the Dolby Digital (a registered trademark) that is formed with a center speaker placed in front of a listener, front speakers placed on the left and right sides of the center speaker, surround speakers placed on the left and right rear sides or left and right sides of the listener, and a sub woofer for exclusively amplifying low-frequency sounds of lower than 120 Hz is known to the public.

Meanwhile, a reproducing system that has an array speaker formed with speaker units having the same characteristics including performance has recently been known. Such a reproducing system drives and controls the speaker units independently of one another, so as to control the directivity of each sound amplified through the array speaker.

This reproducing system includes an array speaker formed with speaker units, and a sound reproducing apparatus that has finite impulse response (FIR) filters for inputting audio signals branching from one signal source and drives the array speaker. The reproducing system is arranged to set the filter characteristics of each of the FIR filters by a nonlinear optimization technique, so that the directivity of each sound amplified through the array speaker has a desired directivity. With this configuration, the reproducing system can control the directivity for each frequency band from a low frequency band to a medium high frequency band (see Patent Document 1, for instance).

Patent Document 1: Japanese Patent No. 2610991

DISCLOSURE OF THE INVENTION

Problems to be Solved by the Invention

When a surround-sound system of the conventional 5.1 ch surround-sound type is put into practical use, however, it is necessary to provide speakers around a listener. As a result, the arrangement of the speakers becomes complicated. Furthermore, in a case where the speakers cannot be placed precisely in predetermined positions due to environmental factors such as the wiring arrangement and the existence of obstacles, the listener cannot have a realistic sensation.

Also, in a reproducing system that drives a conventional array speaker, only the directivity of each direct sound is controlled, and reverberant components that provide a realistic sensation are not generated and amplified. Furthermore, the directivity of each reverberant component is not set. As a result, the reproducing system cannot provide a high realistic sensation to a user.

With the above problems being taken into consideration, the present invention has been developed. An object of the present invention is to provide a sound reproducing system and a sound reproducing apparatus that can provide a high realistic sensation to a user by controlling reverberant components through an array speaker, instead of a plurality of speakers.

Means to Solve the Problems

To solve that problems, the invention according to claim 1 relates to a sound reproducing system comprising:

an array speaker having a plurality of speaker units secured in predetermined arrangement positions; and an sound reproducing apparatus that includes retrieving means for retrieving a sound signal, and drives each of the speaker units and causes the array speaker to amplify the retrieved sound signal in a sound space, wherein the sound reproducing apparatus comprises:

dividing means for dividing the retrieved sound signal by the same number as the number of speaker unit group formed with a predetermined number of speaker units, so as to obtain unit signals;

signal processing means for performing signal processing on each of the divided unit signals, based on preset reverberant characteristics and the arrangement positions of the respective speaker units in the array speaker, and generating and adding reverberant components to the divided unit signals; and driving means for outputting the unit signals subjected to the signal processing to the respective speaker units, so as to drive the array speaker, and wherein when generating the reverberant components, the signal processing means performs the signal processing on each of the divided unit signals, so as to generate the reverberant components that have directivities, when the reverberant components are output from the array speaker, controlled.

In addition, the invention according to claim 8 relates to a sound reproducing apparatus that amplifies a sound signal through an array speaker having a plurality of speaker units secured in predetermined arrangement positions, comprising:

retrieving means for retrieving the sound signal;

dividing means for dividing the retrieved sound signal by the same number as the number of speaker unit group that is formed with a predetermined number of speaker units, so as to obtain unit signals;

signal processing means for performing signal processing on each of the divided unit signals, based on preset reverberant characteristics and the arrangement positions of the respective speaker units in the array speaker, and generating and adding reverberant components to the divided unit signals; and driving means for outputting the unit signals subjected to the signal processing to the respective speaker units, so as to drive the array speaker, and wherein when generating the reverberant components, the signal processing means performs the signal processing on each of the divided unit signals, so as to generate the reverberant components that have directivities, when output from the array speaker, controlled.

EXPLANATION OF REFERENCE NUMERALS

Figure 1:
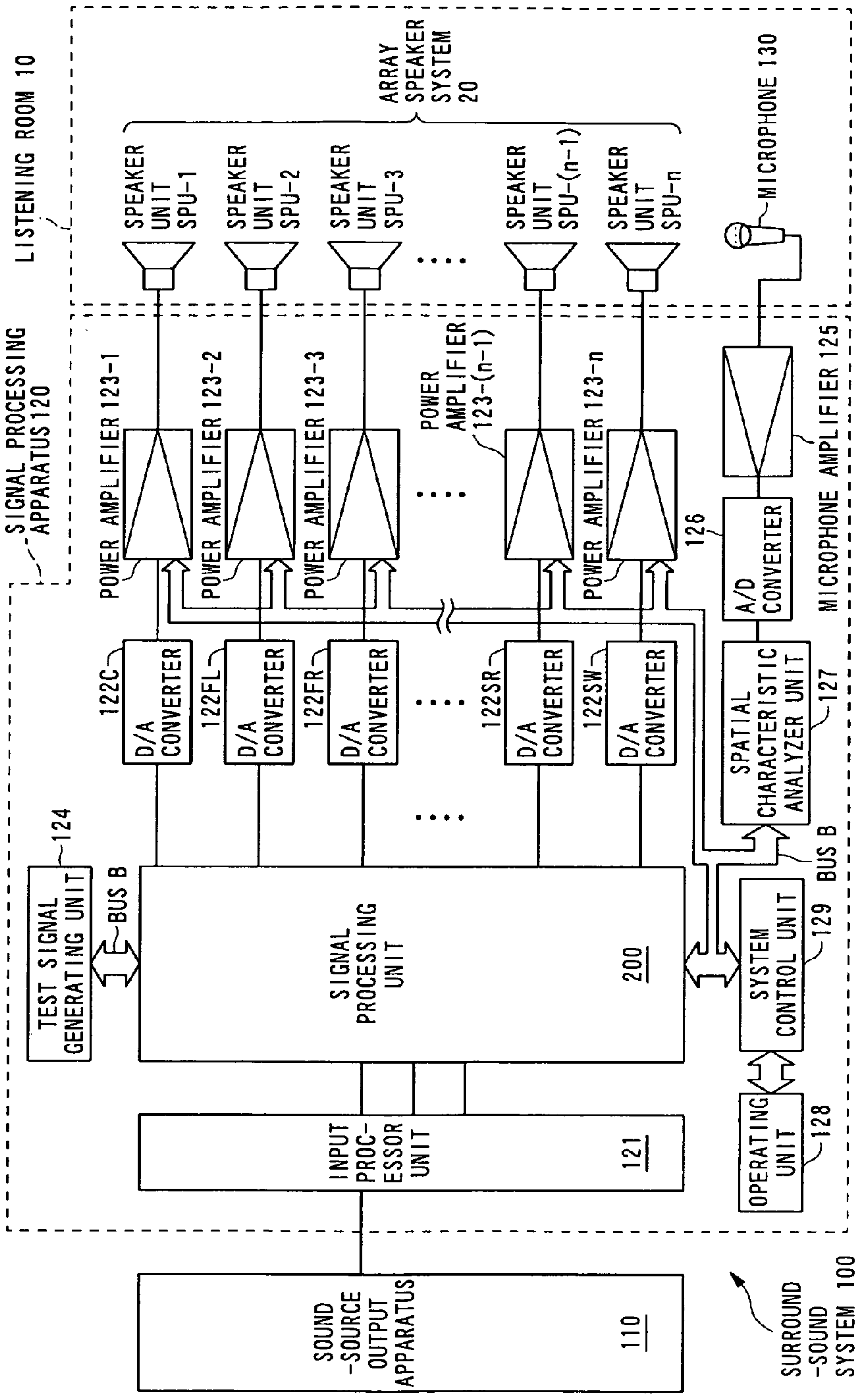
FIG. 1 is a block diagram showing the configuration of a surround-sound system 100 of a first embodiment according to the present invention.

100 surround-sound system
102 signal processing apparatus
130 speaker system
127 spatial characteristics analyzing unit
127C reverberant characteristics analyzing unit
128 operating unit
129 system control unit
130 microphone
200 signal processing unit
250, 350 filtering unit
251 dividing unit
252 adding unit
260 signal processing control unit
351 reverberant component generating unit
352 directivity control unit
SPU speaker unit
F filter
D delay

PREFERRED EMBODIMENTS FOR CARRYING OUT THE INVENTION

The following is a description of preferred embodiments of the present invention, with reference to the accompanying drawings.

The embodiments described below are example cases where a sound reproducing apparatus or a sound reproducing system of the present invention is implemented in a 5.1 ch surround-sound system (hereinafter referred to simply as a surround-sound system).

First Embodiment

First, a surround-sound system of a first embodiment according to the present invention is described, with reference to FIGS. 1 through 11.

Figure 2:
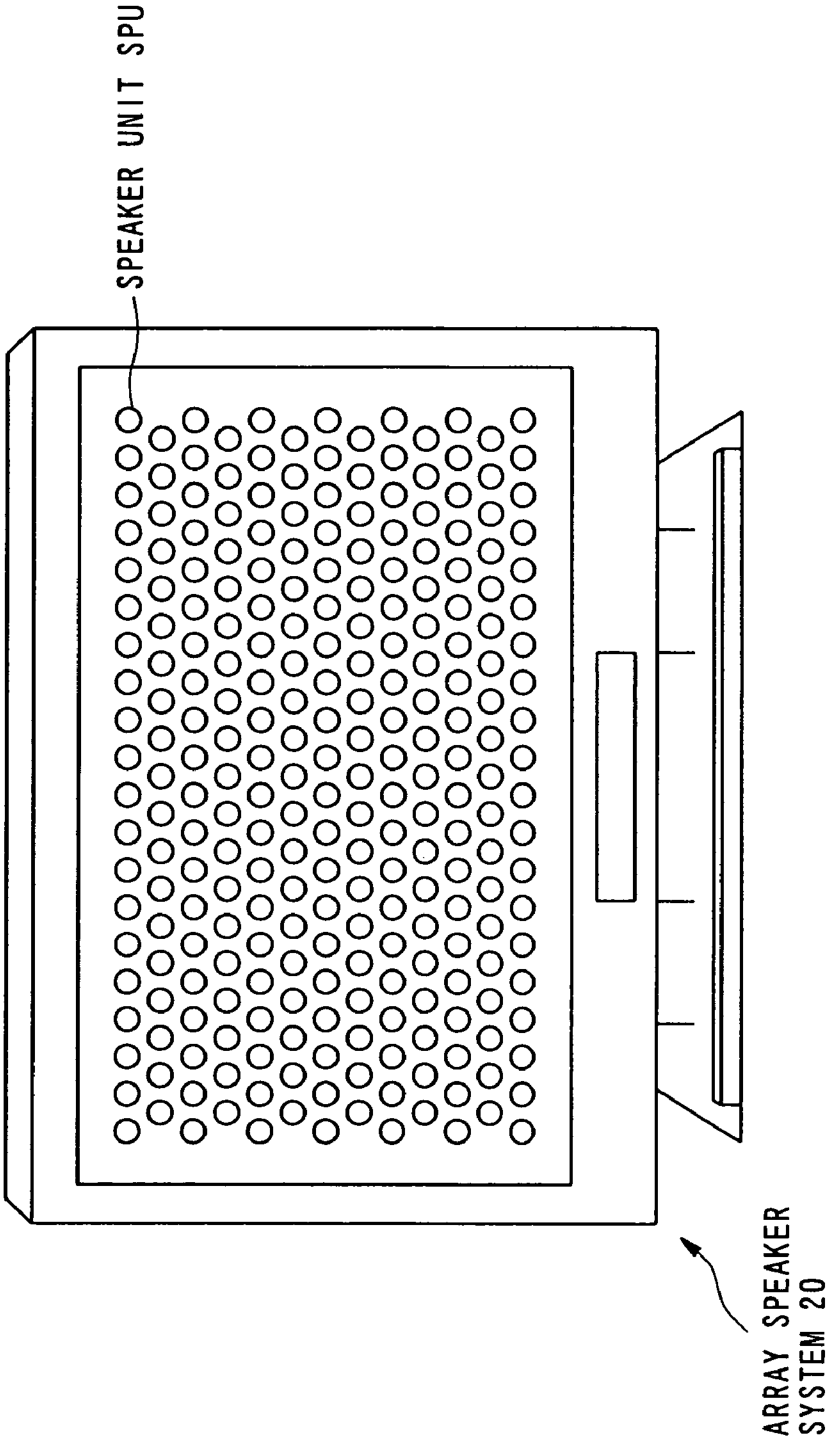
FIG. 2 shows an example of an array speaker that amplifies audio signals in the listening room 10 of the first embodiment.

Referring to FIGS. 1 and 2, the configuration of the surround-sound system of this embodiment is described. FIG. 1 is a block diagram showing the configuration of the surround system of this embodiment. FIG. 2 illustrates an example of an array speaker that amplifies audio signals in a listening room corresponding to this embodiment.

As shown in FIG. 1, the surround-sound system 100 is placed in a listening room 10 that is a sound field for providing reproduced sounds for a listener. The surround-sound system 100 reproduces or obtains sound sources, and performs predetermined signal processing on the reproduced sounds or obtained sounds. The surround system 100 performs signal processing for each 5.1 ch channel, and drives an array speaker system 20 formed with a plurality of speaker units SPU having the same performance and characteristics, so as to provide a sound field that provides a high realistic sensation to the listener.

This surround-sound system 100 includes: a sound-source output apparatus 110 that reproduces sound sources such as recording media or obtains sound sources such as television signals from the outside, so as to output bit stream data that has the channel components suitable for each speaker in the 5.1 ch surround-sound system and the channel component is in a predetermined format; a signal processing apparatus 120 that decodes the bit streams output from the sound-source output apparatus 110 into audio signals of each channel, performs the predetermined signal processing, and analyses the reverberant characteristics and the other spatial characteristics of the listening room 10; an array speaker 20 including a plurality of speaker units SPU having the same characteristics; and a microphone 130 that is used for analyzing the spatial characteristics of the listening room 10.

The "channels" are signal transmission paths for transmitting audio signals to each speaker when a sound is amplified in speaker system of 5.1 ch surround-sound system that includes a front speaker, a surround-sound speaker, a center speaker, and a sub woofer, and the like. Each "channel" is arranged to transmit audio signals having different components from other "channels".

For example, the signal processing apparatus 120 of this embodiment embodies the sound reproducing apparatus of the present invention, and the array speaker system 20 embodies the array speaker of the present invention.

The sound-source output apparatus 110 formed with an apparatus for reproducing media such as CDs (Compact Discs) and DVDs (Digital Versatile Discs), or a reception apparatus that receives digital television broadcasting. This sound-source output apparatus 110 reproduces a sound source such as a CD or obtains a broadcast sound source, and then outputs bit stream data having the respective channel components suitable for each of the 5.1 ch to the signal processing apparatus 120.

The signal processing apparatus 120 receives the bit stream data having the respective channel components output from the sound-source output apparatus 110. The signal processing apparatus 120 is arranged to decode the input bit stream data into audio signals for the respective channels.

The signal processing apparatus 120 also performs the following operations:

(1) adjusting the frequency characteristics for the decoded audio signal or test signal for each channel;

(2) adjusting the signal level and the delay in the decoded audio signal or test signal for each channel;

(3) calculating a coefficient that is to be used for generating reverberant components based on the spatial characteristics of the listening room 10 when an audio signal or test signal is amplified through the array speaker system 20, especially based on the later described reverberant characteristics, and is to be used for the later described filtering for each of the speaker units SPU constituting the array speaker system 20 (the coefficient being hereinafter referred to as the filter coefficient);

(4) performing signal processing so as to divide the frequency-adjusted and signal-level-adjusted audio signals or test signals by the same number as the number of speaker units constituting the array speaker system 20, and to generate the reverberant components based on the calculated filter coefficient for each of the divided audio signals (hereinafter referred to as unit signals); and (5) analyzing the spatial characteristics such as the frequency characteristics and reverberant characteristics at the listening position in the listening room 10 and arranged to convert each unit signal subjected to the above processes and then adjust the sound volume level. The signal processing apparatus 120 then outputs each sound-level-adjusted unit signal to each speaker unit SPU of the array speaker system 20.

The signal processing apparatus 120 divides the frequency-adjusted and signal-level-adjusted audio signals or test signals into signals having the same components. The configuration and operations of the signal processing apparatus 120 of this embodiment will be described later in detail.

The microphone 130 is connected to the signal processing apparatus 120, and is placed at the listening position in which a listener listens to sounds. The microphone 130 is used when the spatial characteristics of the listening room 10 are analyzed. More specifically, the microphone 130 of this embodiment collects amplified sounds that are output from the array speaker system 10 and based on the test signals. The microphone 130 then converts the collected amplified signals into electric signals, and outputs the electric signals as collected-sound signals (also referred to as amplified-sound signals) to the signal processing apparatus 120.

The array speaker system 20 is formed with a plurality of the speaker units SPU having the same characteristics including performance. The speaker units SPU are driven independently of one another by the signal processing apparatus 120. In the listening room 10, this array speaker system 20 is placed in a predetermined position in front of a listener, and amplifies each audio signal that is input for the listener.

More specifically, this array speaker system 20 is formed with the speaker units SPU that have the same shapes and the same characteristics such as the frequency characteristics of the sound amplified when audio signal or test signals are amplified, the directional pattern indicating the directional characteristics of the amplified sound, the transitional characteristics indicating the reproducible characteristics observed when the amplified sound is amplified for each frequency, the phase characteristics indicating the characteristics of the phase of each frequency in the amplified sound, including the performance such as the efficiency rate indicating the ratio of the energy of the amplified sound to the signal supplied to each speaker unit SPU. In this array speaker system 20, the speaker units SPU are arranged at regular intervals both horizontally and vertically. Also, as will be described later, each of the speaker units SPU is connected to each corresponding power amplifier 123 in the image processing apparatus 120. Also, each speaker unit SPU is driven independently of the other speaker units SPU.

For example, in the array speaker system 20, as shown in FIG. 2, the speaker units SPU each having a 2.5 cm diameter are arranged at regular intervals both vertically and horizontally. The array speaker system 20 is formed with 254 speaker units SPU, and a unit signal that is output from each power amplifier 123 of the signal processing apparatus 120 is input to each speaker unit SPU.

Next, the configuration and operation of the signal processing apparatus 120 of this embodiment are described.

As shown in FIG. 1, the signal processing apparatus 120 of the present embodiment includes: an input processing unit 121, to which the bit stream data in the predetermined format having the respective channel components is input, and which converts the bit stream data into audio data in a signal format that is to be used for decoding audio signals for each channel; a signal processing unit 200 that decodes the converted audio data into audio signals for each channel, and performs signal processing for each channel; digital-analog (hereinafter referred to as D-A) converters 122 that D-A convert the audio signals for the respective channels; and power amplifiers 123 that amplifies the signal level of each signal for each channel independently of the other channels.

This signal processing apparatus 120 also includes: a test signal generating unit 124 that generates test signals that are to be used for analyzing the spatial characteristics of the listening room 10; a microphone amplifier 125 that amplifies each signal collected by the microphone 130 to a predetermined signal level; an analog-digital (hereinafter referred to as A-D) converter 126 that A-D converts each amplified collected-sound signal from an analog signal to a digital signal; a spatial characteristics analyzing unit 127 that analyzes the spatial characteristics of the listening room 10, based on each collected-sound signal converted into a digital signal; an operating unit 128 for operating each unit; and a system control unit 129 that controls each unit, based on each operation of the operation unit 128.

The input processing unit 121 of this embodiment embodies the retrieving device of the present invention, and the signal processing unit 200 embodies the dividing device and the signal processing device of the present invention, for example. Also, the power amplifiers 123 of this embodiment embody the driving device of the present invention, for example.

The bit stream data of the predetermined format having the respective channel components is input to the input processing unit 121. This input processing unit 121 converts the input bit stream data into audio data of the predetermined format, and outputs the converted audio data to the signal processing unit 200.

The audio data that is output from the input processing unit 121 and the test signals generated from the test signal generating unit 124 are input to the signal processing unit 200. This signal processing unit 200 decodes the input audio data into audio signals for the respective channels.

Also, this signal processing unit 200 performs the predetermined signal processing on each decoded audio signal or input test signal for each channel. The signal processing unit 200 then generates unit signals based on each signal-processed audio signal for each channel, and outputs each of the generated unit signals to each of the D-A converters 122. More specifically, the signal processing unit 200 not only adjusts the frequency characteristics and signal level and controls the delay time, but also divides each audio signal or test signal by the same number as the number of speaker units, so as to obtain unit signals; performs the later described filtering on each of the divided unit signals; and outputs each filter-processed unit signal to each corresponding D-A converter 122 for controlling the directivity of each amplified sound of the later described reverberant components output from the array speaker system 20.

Based on the reverberant characteristics calculated by analyzing the spatial characteristics of the listening room 10, the signal processing unit 200 generates reverberant components for each input signal, and performs the predetermined filtering on each of the unit signals with respect to the generated reverberant components. By doing so, the signal processing unit 200 controls the directivity of the reverberant components, when an audio signal or test signal is amplified through the array speaker system 20. Also, the configuration and operations of the signal processing unit 200 of this embodiment will be described later in detail.

Each of the signal-processed unit signals is input to each corresponding one of the D-A converters 122. Each of the D-A converters then converts the input unit signal, which is a digital signal, into an analog signal, and outputs the analog signal to each corresponding one of the power amplifiers 123.

Each of the power amplifiers 123 is provided for each corresponding one of the speaker units SPU, and the power amplifiers 123 are connected to the speaker units SPU in one-to-one correspondence. Each of the signal-processed unit signals is input to each corresponding one of the power amplifiers 123. Under the control of the system control unit 129, the power amplifiers 123 collectively amplify the reproduction level of each unit signal, based on an instruction as to the sound volume that is set through the operating unit 128. The power amplifiers 123 then output the amplified unit signals to the respective speaker units SPU.

The test signal generating unit 124 generates the test signals to be used for adjusting the frequency characteristics of the listening room 10 and the reproduction level, analyzing the delay time, and analyzing the spatial characteristics such as reverberant characteristics. The test signal generating unit 124 then outputs the generated test signals to the signal processing unit 200. More specifically, under the control of the system control unit 129, the test signal generating unit 124 generates test signals such as white noise, pink noise, and sweep signals for sweeping frequencies in a predetermined frequency range. The test signal generating unit 124 then outputs the generated test signals to the signal processing unit 200.

Under the control of the system control unit 129, the test signal generating unit 124 of this embodiment generates the test signals in cooperation with the signal processing unit 200 and the spatial characteristics analyzing unit 127.

The collected-sound signals that are output from the microphone 130 are input to the microphone amplifier 125. The microphone amplifier 125 amplifies the collected-sound signals to a predetermined signal level, and outputs the amplified collected-sound signals to the A-D converter 126.

The collected-sound signals that are output from the microphone amplifier 125 are input to the A-D converter 126. The A-D converter 126 converts each of the collected-sound signals from an analog signal to a digital signal, and outputs the collected-sound signals converted to digital signals to the spatial characteristics analyzing unit 127.

The collected-sound signals converted to digital signals are input to the spatial characteristics analyzing unit 127. Based on the input collected-sound signals, the spatial characteristics analyzing unit 127 analyzes the frequency characteristics of each amplified sound output for each channel, analyzes the reproduction level, analyzes the delay time, and analyzes the reverberant characteristics. Based on each of the analysis results, the spatial characteristics analyzing unit 127 calculates predetermined parameters for determining a coefficient to be required by the signal processing unit 200 to perform each signal processing operation, and outputs the data of each calculated parameter to the signal processing unit 200. More specifically, the spatial characteristics analyzing unit 127 of this embodiment carries out each analysis based on the collected-sound signals based on the test signals output from the speaker system 130, and calculates each parameter.

The operating unit 128 is formed with a remote control device having various confirmation buttons, select buttons, and various keys such as numeric keys. The operating unit 128 is to be used for inputting instructions when the spatial characteristics of the listening room 10 are analyzed.

More specifically and as will be described later, the operating unit 128 of this embodiment is to be used for controlling the directivity of each amplified sound based on the reverberant characteristics of a given sound field in the listening room 10 (this control operation will be hereinafter referred to as the amplified-sound directivity control). For example and as will be described later, the operating unit 128 is used for setting the listening position, the focal angle and the reference distance of the reverberant components, the transmission distance of each of the reverberant components, and the coordinates of each speaker unit SPU in the array speaker system 20.

The system control unit 129 retrieves each of those set values directly when they are calculated, or temporarily stores each of those set values inside and retrieves each of those set values when calculating each filter coefficient. The coordinates of each speaker unit SPU may not be set by the operating unit 128, but may be prestored in the system control unit 129.

The system control unit 129 collectively controls the functions for amplifying audio signals through the array speaker system 20. More specifically, the system control unit 129 causes the signal processing unit 200 to perform an operation for calculating the filter coefficient of each speaker unit SPU (this operation will be hereinafter referred to as the filter coefficient calculating operation) and an operation for setting the filter coefficient so as to control the directivity.

Figure 3:
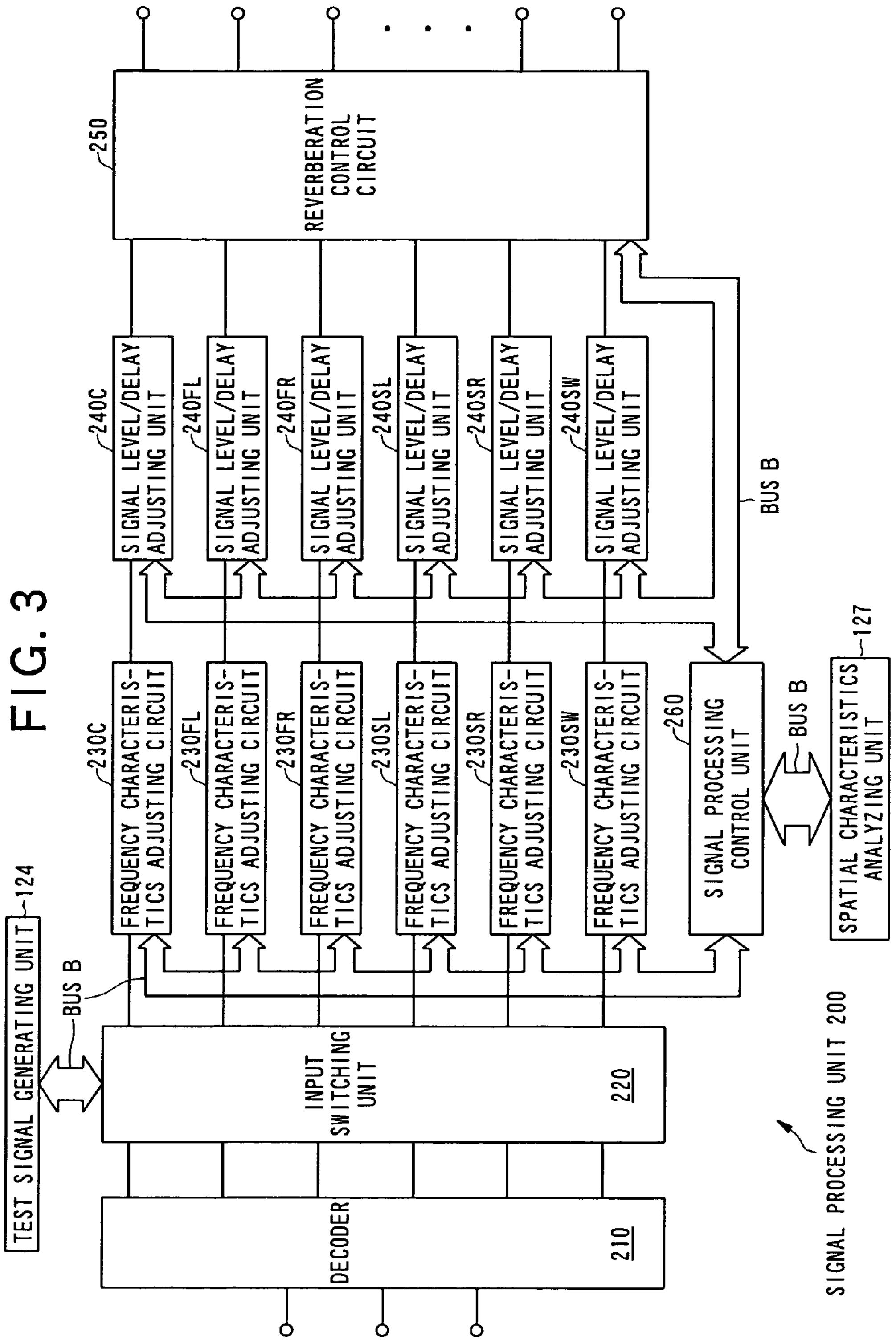
FIG. 3 is a block diagram showing the configuration of the signal processing unit of the first embodiment.

Referring now to FIG. 3, the configuration and operations of the signal processing unit 200 of this embodiment are described. FIG. 3 is a block diagram showing the configuration of the signal processing unit 200 of this embodiment.

As described above, the signal processing unit 200 divides each decoded audio signal or input test signal by the same number as the number of speaker units SPU, so as to obtain unit signals; performs the later described filtering on each divided unit signal; and outputs each of the filtered unit signals to each corresponding one of the D-A converters 122.

More specifically, the signal processing unit 200 includes: a decoder 210 that decodes input audio data into an audio signal for each channel; an input switching unit 220 that switches between the audio signal for each channel output from the data and an input test signal; frequency characteristics adjusting circuits 230 that adjust the frequency characteristics of the audio signals of the respective channels or the test signals; signal level/delay adjusting units 240 that adjust the signal level between the channels, and delay signals input for the respective channels; a filtering unit 250 that divides each audio signal for each channel or test signal by the same number as the number of speaker units, and performs filtering on each of the divided unit signals; and a signal processing control unit 260 that controls each component in the signal processing unit 200 under the control of the system control unit 129, and calculates and sets the filter coefficient of each filter of the filtering unit 250.

The signal processing unit 200 has a frequency characteristics adjusting circuit 230 and a signal level/delay adjusting unit 240 for each one channel. The signal processing control unit 260 is connected to the other components with buses B.

The input audio data, such as bit clock signals, LR clock signals, and compressed audio data, are input to the decoder 210. The decoder 210 decodes the input audio data into the audio signals for each channel, and outputs the audio signals to the input switching unit 220 for each channel.

The audio signals decoded for each channel and the test signals output from the test signal generator 124 are input to the input switching unit 220. Under the control of the signal processing control unit 260, the input switching unit 220 switches the input between an audio signals output from the decoder 210 and a test signal generated by the test signal generating unit 124, and outputs the signals to each of the frequency characteristics adjusting circuits 230. When outputting a test signal, the input switching unit 220 outputs the test signal to each channel.

In each frequency characteristics adjusting circuit 230, a frequency adjustment coefficient for adjusting the gain of signal components is set for each frequency band, under the control of the signal processing control unit 260. The input audio signals or test signals of each channel are input to each of the frequency characteristics adjusting circuits 230. Each of the frequency characteristics adjusting circuits 230 adjusts the frequency characteristics with respect to each input signal based on the set frequency coefficient, and outputs the signals having the adjusted frequency characteristics to each corresponding one of the signal level/delay adjusting units 240.

In each of the signal level/delay adjusting units 240, the coefficient for adjusting the attenuation rate between the channels (hereinafter referred to as the attenuation coefficient) and the coefficient for adjusting the delay (or the delay time) in the audio signal or test signal for each channel (hereinafter referred to as the delay control coefficient) are set for each channel, under the control of the signal processing control unit 260. The audio signal or test signal having the frequency characteristics adjusted for each frequency band are also input to each of the signal level/delay adjusting units 240. Based on the attenuation coefficient and the delay control coefficient, each of the signal level/delay adjusting units 240 adjusts the attenuation rate and the delay between the channels with respect to each input signal. Each of the signal level/delay adjusting units 240 then outputs the audio signal or test signal having the adjusted attenuation rate and the adjusted delay to the reverberation control circuit 250.

The audio signal or test signal for each channel is input to the filtering unit 250. The filtering unit 250 divides the input audio signal or test signal by the same number as the number of speaker units, so as to obtain unit signals. The filtering unit 250 then performs filtering on each of the divided unit signals. The filtering unit 250 adds up the unit signals for each speaker unit SPU, and outputs the sum of the unit signals to each of the D-A converters 122.

More specifically, the filtering unit 250 performs filtering on each unit signal respectively, based on the filter coefficient that is calculated for each channel by the signal processing control unit 260.

In this embodiment, based on the filter coefficient, the filtering unit 250 performs predetermined processing on each signal to be amplified for each speaker unit SPU, so that the reverberant components are added to each input signal, and the directivity when amplifying the added reverberant components is controlled. The configuration and operations of the filtering unit 250 of this embodiment will be described later in detail. The filtering unit 250 of this embodiment embodies the dividing device and the signal processing device of the present invention, for example.

Corresponding to an instruction from the system control unit 129, the signal processing control unit 260 determines and sets each of the coefficients for the respective frequency characteristics adjusting circuits 230 and the respective signal level/delay adjusting units 240. More specifically, the signal processing control unit 260 determines the frequency adjustment coefficients, the attenuation coefficients, and the delay control coefficients, based on the data of each parameter analyzed by the spatial characteristics analyzing unit 127. The signal processing control unit 260 sets those determined coefficients in the respective frequency characteristics adjusting circuits 230 and the respective signal level/delay adjusting units 240.

The signal processing control unit 260 also retrieves preset values or presorted values inside, and the data of the parameters to be used for determining the filter coefficients calculated by the spatial characteristics analyzing unit 127 (the parameters will be hereinafter referred to as the reverberant parameters). Based on the reverberant parameters, the signal processing control unit 260 calculates the filter coefficient for performing filtering on each unit signal in the filtering unit 250, and sets each calculated filter coefficient in the filtering unit 250.

More specifically, the signal processing control unit 260 of this embodiment calculates the coefficient for adding reverberant components to each input signal in the filtering unit 250, based on the reverberant parameters calculated by the spatial characteristics analyzing unit 127. The signal processing control unit 260 also performs the predetermined processing on the calculated coefficient so as to calculate the filter coefficient for controlling the directivity of the amplified sound of the reverberant components when the reverberant components added to the input signal are amplified through the array speaker system 20.

The filter coefficients to be calculated by the signal processing control unit 260 of this embodiment will be described later in detail.

Figure 4:
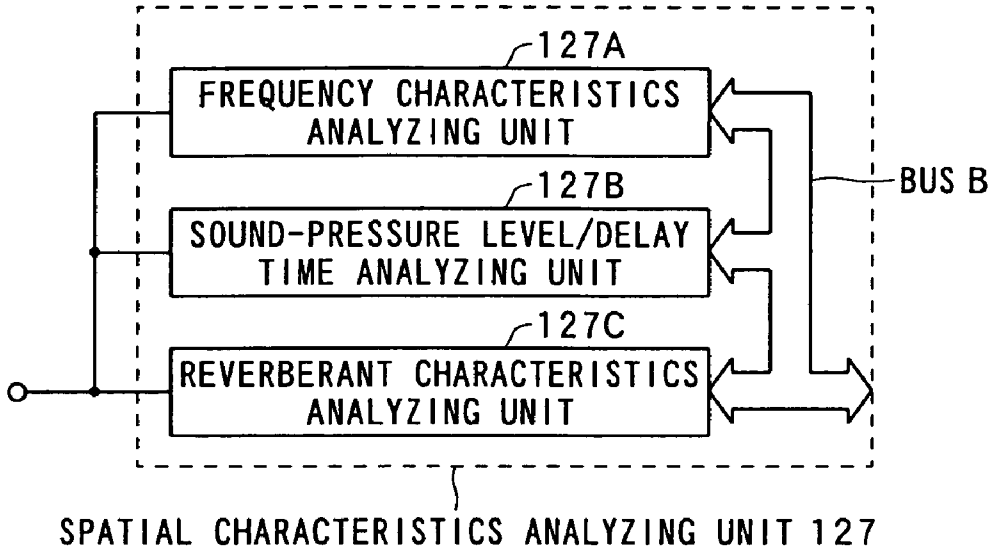
FIG. 4 is a block diagram showing the configuration of the spatial characteristics analyzing unit of the first embodiment.

Referring now to FIG. 4, the configuration and operations of the spatial characteristics analyzing unit 127 of this embodiment are described. FIG. 4 is a block diagram showing the configuration of the spatial characteristics analyzing unit 127 of this embodiment.

Collected-sound signals that are generated by collecting sounds amplified based on the test signals are input to the spatial characteristics analyzing unit 127. As described above, based on the input collected-sound signals, the spatial characteristics analyzing unit 127 analyzes the frequency characteristics of each amplified sound that is output for each channel, analyzes the sound pressure level, analyzes the delay time, and analyzes the reverberant components. Based on the analysis results, the spatial characteristics analyzing unit 127 outputs the data to the signal processing unit 200 via the system control unit 129.

This spatial characteristics analyzing unit 127 includes: a frequency characteristics analyzing unit 127A that analyzes the frequency characteristics of the listening room 10; a sound-pressure level/delay time analyzing unit 127B that analyzes the sound pressure level and the delay time of the sound amplified through each speaker in the listening room 10; and a reverberant characteristics analyzing unit 127C that analyzes the reverberant characteristics of the listening room 10 and calculates the reverberant parameters when the reverberation control coefficient setting operation is performed.

Based on the input collected-sound signals with respect to the test signals, the frequency characteristics analyzing unit 127A analyzes the frequency characteristics in the placement position (the listening position) of the microphone 130 in the listening room 10, and outputs the analysis results as data of the predetermined parameter to the signal processing control unit 260 via the system control unit 129. Based on the input collected-sound signals with respect to the test signals, the sound-pressure level/delay time analyzing unit 127B analyzes the sound pressure level and the delay time of the sound amplified through each speaker in the placement position of the microphone 130 in the listening room 10, and outputs the analysis results as data of the predetermined parameter to the signal processing control unit 260 via the system control unit 129.

When the filter coefficient calculating operation is performed, the reverberant characteristics analyzing unit 127C analyzes the reverberant characteristics in the listening room 10, based on the input collected-sound signals with respect to the test signals. Corresponding to the analysis results, the reverberant characteristics analyzing unit 127C determines the reverberant parameters to be used by the signal processing control unit 260 to determine the filter coefficients, and outputs the determined reverberant parameters as the data to the signal processing control unit 260.

More specifically, based on the input collected-sound signals with respect to the test signals, the reverberant characteristics analyzing unit 127C calculates the attenuation of the amplitude level for each frequency band, with the amplified sound (the direct sound) that first reaches the listening position through a speaker being the reference value and the reverberation time that represents the time when the amplified sound first reaches the listening position. Based on the input collected-sound signals, the reverberant characteristics analyzing unit 127C analyzes the directivity of the amplified sound that reaches the listening position after being reflected by the wall surface of the listening room 10 over a predetermined reverberation time, for example, 80 msec since the amplified sound (the direct sound) first reaches the listening position from a speaker.

In general, a reverberation time represents the time elapsed while the sound pressure level drops 60 dB from the initial sound pressure level, which is the sound pressure level of the direct sound. Therefore, the reverberant characteristics analyzing unit 127C of this embodiment calculates the time elapsed while the sound pressure level drops 60 dB from the sound pressure level of the direct sound, and sets the calculated time as the reverberation time.

The reverberant characteristics analyzing unit 127C also compares the reverberation time calculated based on the collected-sound signals with a target reverberation time prestored inside. As a result of the comparison, the reverberant characteristics analyzing unit 127C determines the reverberation time to be used by the reverberation control circuit 250 to generate a reverberation time. Based on the determined reverberation time, the reverberant characteristics analyzing unit 127C calculates the reverberant parameters.

When outputting the calculated reverberant parameters to the signal processing control unit 260, the reverberant characteristics analyzing unit 127C also outputs the data representing the directivity of the analyzed amplified sound, together with the reverberant parameters, to the signal processing control unit 260.

Figure 5:
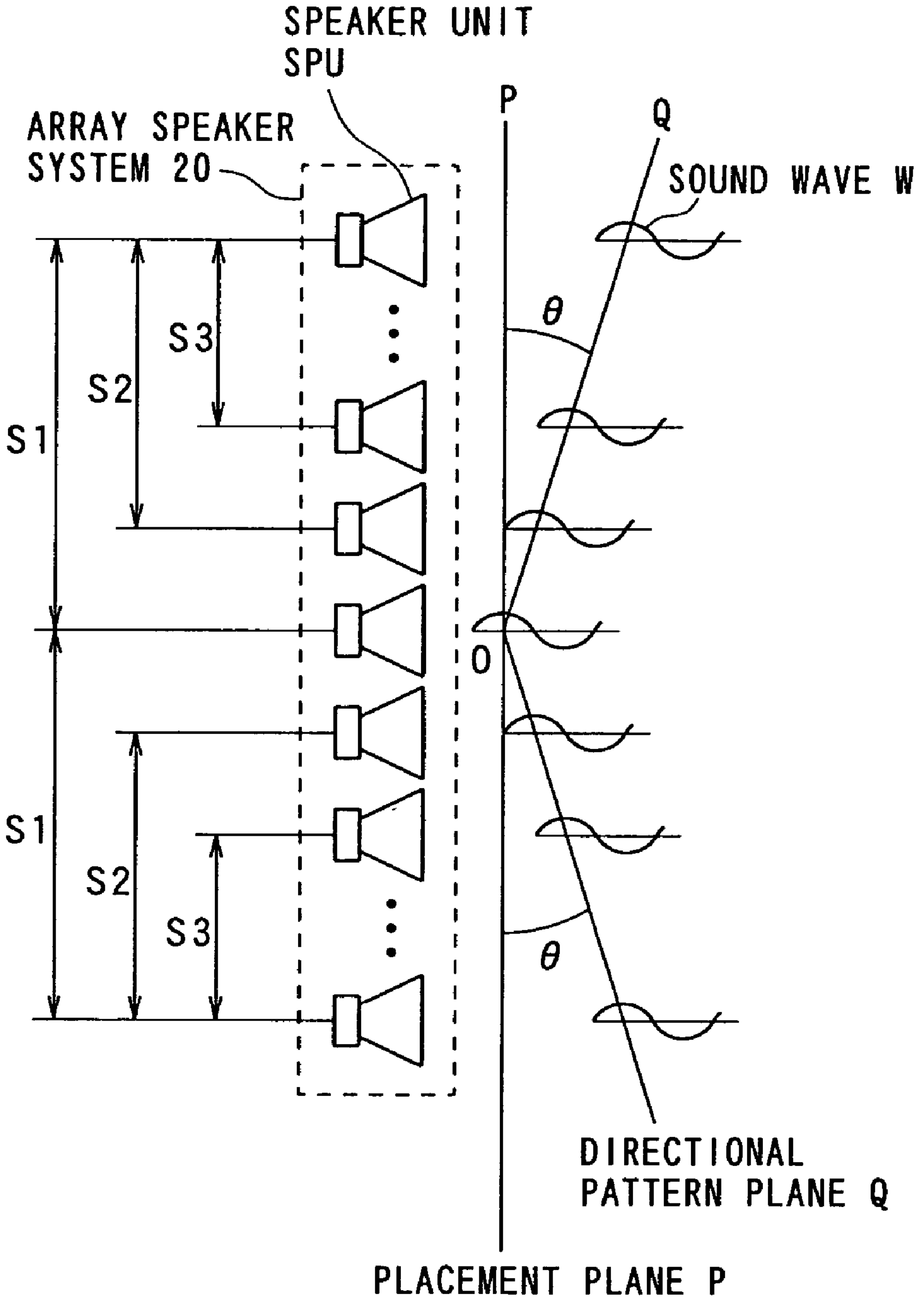
FIG. 5 is a first chart showing the correlations between the sound wave and the delay amount of the sound amplified by each speaker unit when the directivity is set.
Figure 6:
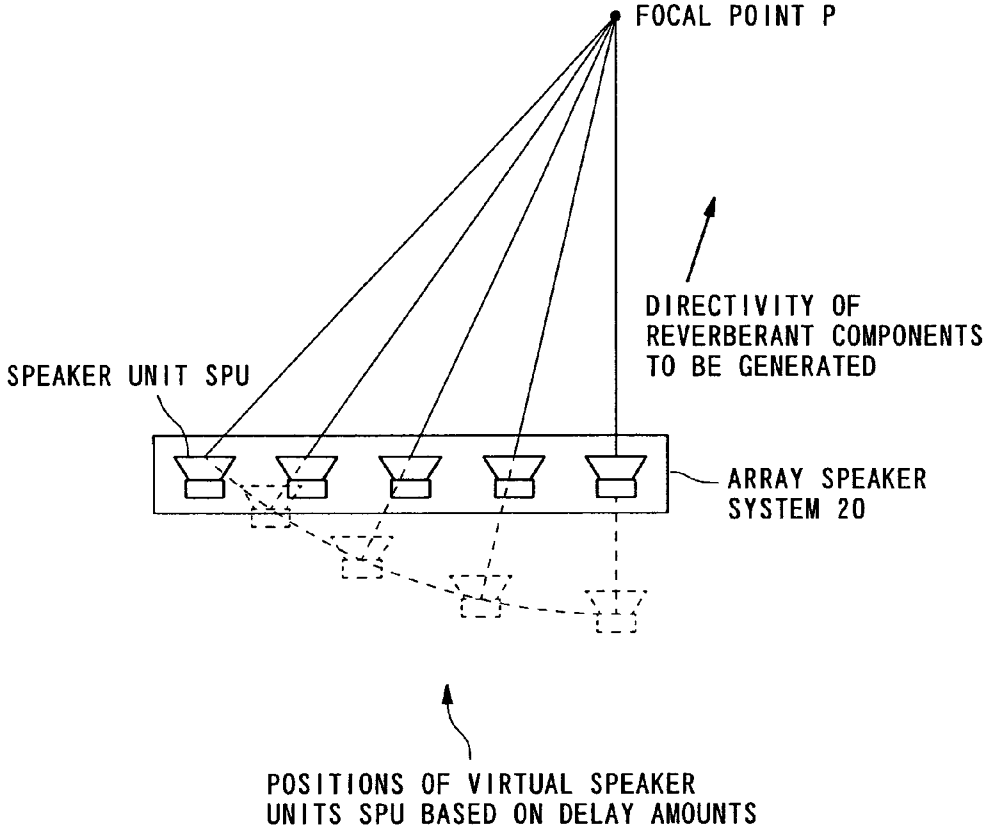
FIG. 6 is a second chart showing the correlations between the sound wave and the delay amount of the sound amplified by each speaker unit when the directivity is set.
Figure 7:
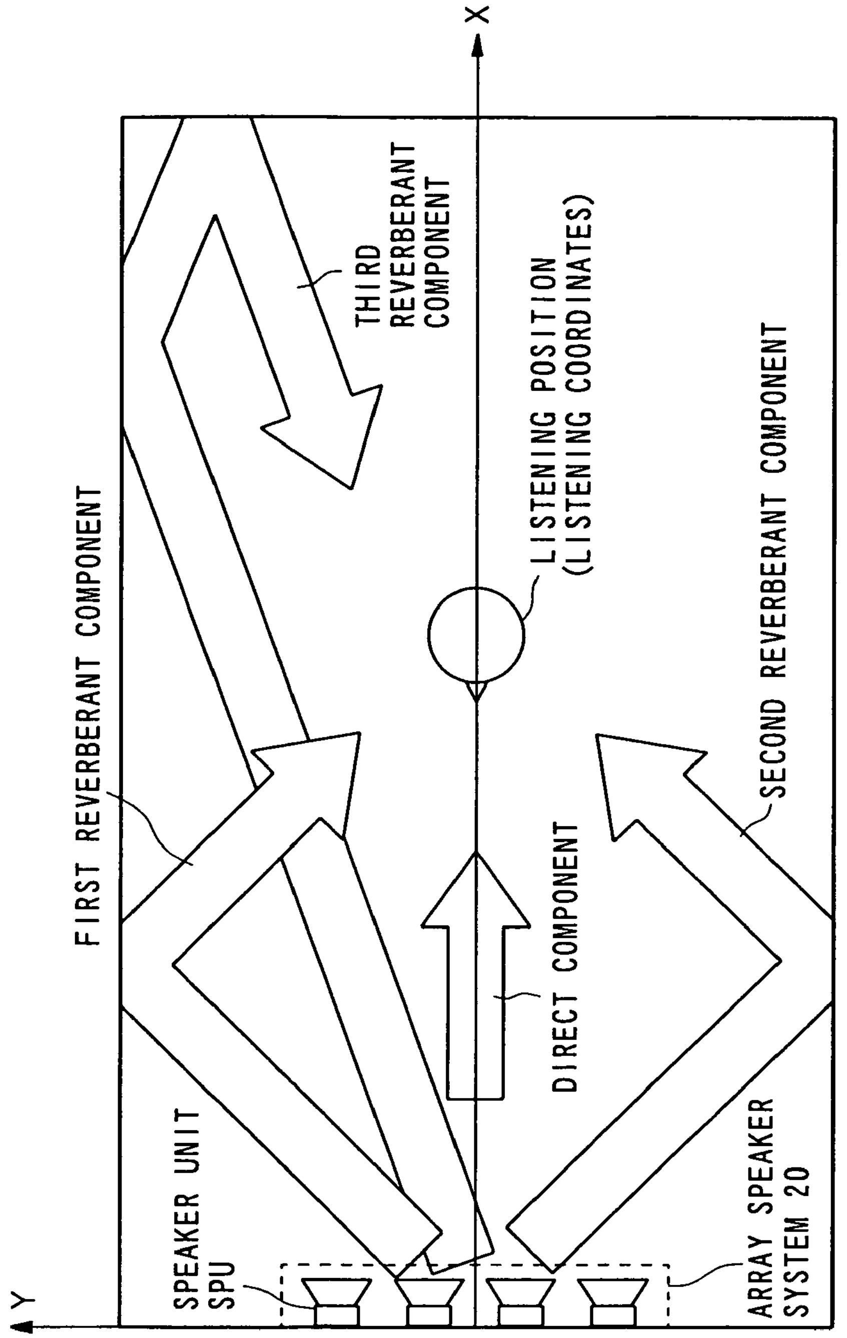
FIG. 7 shows the filter coefficients to be calculated by the signal processing control unit of the first embodiment.
Figure 8:
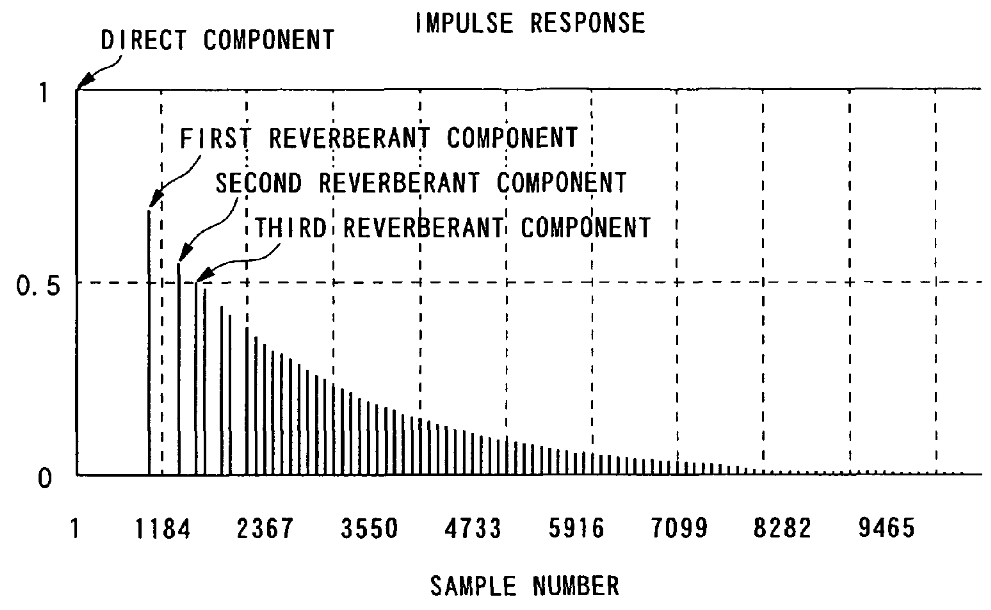
FIG. 8 shows an example of the target reverberant characteristics to be used for calculating the filter coefficients in the first embodiment.

Referring now to FIGS. 5 through 8, the filter coefficients to be calculated by the signal processing control unit 260 are described. FIGS. 5 and 6 show the correlations between the sound wave and the delay amount of the sound amplified through each speaker unit SPU when the directivity is set. FIG. 7 shows the filter coefficients to be calculated by the signal processing control unit 260 of this embodiment. FIG. 8 shows an example of the target reverberant characteristics to be used for calculating the filter coefficients in this embodiment.

Based on the reverberant parameters calculated by the spatial characteristics analyzing unit 127 analyzing the listening room 10, the signal processing control unit 260 of this embodiment calculates the coefficient for adding a reverberant component to each input signal, and, while calculating the coefficient, calculates each coefficient for performing filtering on each of the divided unit signals that are the same as the speaker units in number (the coefficient will be hereinafter referred to as the filter coefficient) for each channel. Accordingly, the signal processing control unit 260 adds reverberant components to the input signals in the filtering unit 250, and calculates the filter coefficients for controlling the directivities of the sounds of the reverberant components amplified through the array speaker system 20.

In general, when amplification is performed in the array speaker system 20, each of unit signals that are obtained by dividing each input audio signal or test signal are delayed and amplified independently of one another, so that each of the unit signals have a predetermined pattern. In this manner, phase differences are caused among the sound waves produced by amplifying each of the unit signals based on the delay amounts. Accordingly, when a listener at the listening position listens to the sound waves having the phase difference as an amplified sound, the listener can listen to an amplified sound with directivity.

More specifically, since the speaker units SPU forming the array speaker unit 20 are regularly arranged in a symmetrical fashion both horizontally and vertically, the distance between a subject speaker unit SPU and any other speaker unit SPU can be determined in advance. Also, as each unit signal to be amplified is delayed with respect to the direction of setting the directivity based on the distance, the directivity to be felt at the listening position where a listener listens to the amplified sound can be controlled.

For example, as shown in FIG. 5, n speaker units SPU are arranged on left side and right side respectively at regular intervals in the array speaker system 20, and a directivity is to be provided in the direction from the center of the front face of the array speaker system 20. In this case, each unit signal to be amplified through each corresponding one of the speaker units SPU is delayed in a horizontally symmetrical fashion, based on the distance S1, S2, or S3 between given two speaker units SPU. Each unit signal is then amplified through each corresponding one of the speaker units SPU. Each sound wave w generated as a result of amplification of each unit signal has a phase difference, with a directional pattern face Q with a predetermined angle θ from the placement plain P of the speaker units SPU being the reference plane. Accordingly, when each delayed sound wave w is listened to at the listening position, the amplified sound exhibits directional characteristics, or a directivity, from the center of the front face of the array speaker system 20. In other words, to provide an amplified sound with a directivity in the direction of the focal point P, as shown in FIG. 6, delay times should be set so that amplified sounds from the respective speaker units SPU can reach the focal point P at the same time. In this manner, the directivity of the amplified sounds can be controlled.

Meanwhile, in a case where the directivity of each reverberant component is to be controlled in the array speaker system 20, it is necessary to cause a delay of each reverberant component to be amplified for each unit signal, so as to set the directivity of each reverberant component.

For example, as shown in FIGS. 7 and 8, in a case where a direct component is amplified toward the listening position without being reflected toward a user, and where a plurality of reverberant components to be added to the direct component with short reverberant times are formed independently of one another, the transmission paths of the respective reverberant components to the listening position have different lengths if a certain directivity is set for the reverberant components such as a first reverberant component, a second reverberant component, and a third reverberant component shown in FIG. 8.

More specifically, the transmission distances of the direct component and the reverberant components between the array speaker system 20 and the listening position vary as illustrated in FIG. 7. Therefore, to control the directivities of the reverberant components independently of one another, it is necessary to modify the unit signals with respect not only to the delay amounts for controlling the directivities (hereinafter referred to as the directivity control delay amounts) but also to the delay amounts of the respective reverberant components for the unit signals based on the transmission path lengths (hereinafter referred to as the distance correction delay amount).

Therefore, based on the input reverberant parameters, the directivity to be set for each reverberant sound, and the length of the transmission path of each reverberant sound, the signal processing control unit 260 of this embodiment calculates each filter coefficient for the filtering unit 250 to generate unit signals for amplifying the reverberant components when sounds are amplified through the array speaker system 20, while maintaining the direct component.

The reverberant characteristics shown in FIG. 8 are target reverberant characteristics of the listening room 10, and indicate the correlations between the sample number to be used for calculating the filter coefficients and the amplitude level ratio of each of the retrieved reverberant components. The sample number indicates the process intervals at which the filter coefficients are calculated, and 1/Fs represents one sample. The amplitude level ratio indicated by the ordinate axis in FIG. 8 represents the amplitude level ratio of each of normalized reverberant components, with the direct component being “1”.

In the above description, a “direct component” is the component of a test signal or audio signal as is to be amplified by the sound reproducing apparatus 120 for each channel, which is the component of an audio signal retrieved from the sound source output apparatus 110 or a test signal generated by the test signal generating unit 124. A “reverberant component” is a component to be added to a direct component by processing the direct component in the signal processing unit 200, and can be auditorily recognized as a reverberant sound when amplified through the array speaker system 20. On the other hand, a “direct sound” is an amplified sound a listener can listen to directly from the array speaker system 20. A “reflected sound” is an amplified sound that reaches the listening position after reflected in the listening room 10. Accordingly, in this embodiment, a reverberant component may be amplified as a direct sound as a result of a directivity control operation, and a direct component may be amplified as a reflected sound as a result of a directivity control operation on the reverberant components.

In this manner, based not only on the delay amounts to be required for adding reverberant components to a direct component, but also on the delay amounts for controlling the directivity and on the lengths of the transmission paths of the respective reverberant components, the signal processing control unit 260 of this embodiment calculates each filter coefficient for processing the respective unit signals to be amplified, so as to generate a plurality of the reverberant components such as the first reverberant component and the second reverberant component, and provide the respective reverberant components with a predetermined directivity, while maintaining the direct component when unit signals are amplified through signal processing.

More specifically, based on the reverberant parameters calculated from the reverberant characteristics of the listening room 10 calculated by the spatial characteristics analyzing unit 127 and the data indicating the directivity of each component in the reverberant characteristics, the signal processing control unit 260 calculates each filter coefficient for each channel, with respect to each unit signal to be amplified by the corresponding one of the speaker units SPU of each channel, or with respect to each of the later described filters in the filtering unit 250. The signal processing control unit 260 then sets each of the calculated filter coefficients in each corresponding one of the filters for each channel. In the following, the filter coefficient calculating operation to be performed by the signal processing control unit 260 is described.

In the following explanation of the filter coefficient calculating operation, the filter coefficients are described with the use of unit signals to be amplified through the respective speaker units SPU.

[Filter Coefficient Calculating Operation]

(1) First, while a directivity has not been set yet, the signal processing control unit 260 calculates coefficients for adding reverberant components to the respective unit signals (hereinafter referred to as the reverberation adding coefficients), based on the reverberant parameters output from the spatial characteristics analyzing unit 127.

For example, the signal processing control unit 260 calculates the reverberation adding coefficients for adding reverberant components such as the first reverberant component and the second reverberant component shown in FIG. 8 to a direct component that is an audio signal or test signal input to the signal processing unit 200.

Here, each reverberation adding coefficient for the respective reverberant components having the delay amounts of the respective unit signals is a filter coefficient to be set in each corresponding one of the filters that will be described later. Each of the filters convolutes the input unit signals, based on the respective reverberation adding coefficients of the unit signals, so that the reverberant components are added to the respective unit signals.

(2) The signal processing control unit 260 then obtains, as shown in FIG. 7: the coordinates of the listening position in the listening room 10 (hereinafter referred to as the listening coordinates), with the center of the array speaker system 20 being the point of origin; the focal angle that indicates the angle of the focal point in each reverberant component, with respect to the array speaker system 20; and the distances to the focal point (hereinafter referred to as the focal distances). The signal processing control unit 260 obtains those values that are preset through the operating unit 128, or obtains those values by reading the values prestored in the signal processing control unit 260.

In this embodiment, for example, the listening coordinates are shown with the X-axis representing the direction extending from the center of the array speaker system 20 to the listening position and the Y-axis representing the transverse direction of the array speaker system 20, as shown in FIG. 7. The focal point is the point to be reached by the reverberant components, which is the point the same reverberant components amplified through the speaker units SPU reach at the same time, as shown in FIG. 6. The focal point is different in principle from the listening position, and is set for each reverberant component.

(3) Based on the obtained focal angle and focal distances, the signal processing control unit 260 calculates the focal point coordinates with respect to each reverberant component. Based on the number of speaker units SPU in the array speaker unit 20 and the intervals at which the speaker units SPU are arranged both in the vertical and transverse directions, the signal processing control unit 260 also calculates the distance between each focal point and the array speaker system 20, and the distance between each speaker unit and each focal point (hereinafter referred to as the unit-focal distance).

In a case where n reverberant components are to be controlled by m speaker units SPU, for example, the signal processing control unit 260 calculates the focal point coordinates (XFP, YFP) based on the following Equation (1), and also calculates each unit-focal distance (rFP) based on the following Equation (2):

$$(X_{FP}(n)) = \text{reference distance } 1(n) \times \cos(\text{focal angle}\,[\text{rad}(n)])$$
$$(Y_{FP}(n)) = \text{reference distance } 1(n) \times \sin(\text{focal angle}\,[\text{rad}(n)]) \quad \text{[Equation 1]}$$

$$r_{FP}(m, n) = \sqrt{(X_{FP}(n) - X_{SP}(m))^2 + (Y_{FP}(n) - Y_{SP}(m))^2} \quad \text{[Equation 2]}$$

(4) Based on each unit-focal distance, the signal processing unit 200 calculates the directivity control delay amount of each reverberant component with respect to the unit signals input to the respective speaker units SPU, and sets the directivity control delay amount as the directivity control movable sample number.

More specifically, based on each unit-focal distance, the signal processing unit 200 of this embodiment calculates the directivity control delay amount dt (m, n) for each unit signal and each reverberant component, using Equation (3), for example. The signal processing unit 200 then converts each of the calculated directivity control delay amount to the directivity control sample number ds (m, n) based on the Equation (4). In the following equations, "rmax" represents the maximum value of the focal distance (rFP (m, n)) with respect to each focal point, and "c" represents the sound velocity (m/sec). Also, "round" represents an operator that rounds a calculated value to a predetermined digit number so as to produce an approximate number, and "Fs" represents the sampling frequency to be used for analyzing each reverberant component.

$$dt(m,n)=[r_{max}(n)-r_{FP}(m,n)]\div c \quad \text{[Equation 3]}$$

$$ds(m,n)=\text{round}[dt(m,n)/(l/FS)]=\text{round}[dt(m,n)/FS] \quad \text{[Equation 4]}$$

(5) Based on the focal angle, the signal processing control unit 260 next calculates the length of the transmission path (hereinafter referred to as the transmission distance) from the center of the array speaker system 20 to the listening position, with respect to each reverberant component. Also, based on the calculated transmission distance, the signal processing control unit 260 calculates a distance correction delay amount that indicates a delay amount of an arrival time based on the transmission distance, so that the reverberant components reach the listening position in desired order. The signal processing control unit 260 then sets each calculated distance correction delay amount as the distance correction movable sample number.

The signal processing control unit 260 calculates the distance correction delay amount with respect to each reverberant component, based on the transmission distance and the sound velocity obtained as described above, and converts the calculated distance correction delay amount to the distance correction movable sample number, for example. More specifically, the signal processing control unit 260 calculates the distance correction delay amount dLt (n) based on Equation (5), and converts the calculated distance correction delay amount dLt (n) to the distance correction sample number based on Equation (6). Here, L(n) represents the transmission distance with respect to each reverberant component, and dLt (0) represents the distance correction delay amount with respect to a direct component.

$$d_{Lt}(n)=L(n)/c \quad \text{[Equation 5]}$$

$$d_{Ls}(n)=\text{round}[\{d_{Lt}(n)-d_{Lt}(0)\}\times FS] \quad \text{[Equation 6]}$$

(6) Based on the directivity control movable sample number calculated for each reverberant component and for each unit signal and each distance correction movable sample number calculated for each reverberant component, the signal processing control unit 260 next calculates the total movable sample number. Based on each total movable sample number, the signal processing control unit 260 finally determines a coefficient for each unit signal (hereinafter referred to as the reverberant control coefficient).

More specifically, while the directivity control movable sample number indicates the delay amount with respect to each reverberant component, the distance correction movable sample number needs to indicate a time earlier than the original amplifying timing of each reverberant component, with the direct component being the criterion. Therefore, the signal processing control unit 260 subtracts the distance correction movable sample number from the directivity control movable sample number for each unit signal and for each reverberant component, as shown in Equation (1):

$$S(m,n)=d_s(m,n)-d_{LS}(n) \quad \text{[Equation 7]}$$

When determining each coefficient finally and moving each reverberant component based on the total movable sample number, the reverberant component might be moved to a position before the coefficient of the direct component in terms of time. In such a case, the reverberant component coefficient, which is fastest in terms of time, is set as the sample number "1", and, based on the reverberant component coefficient as well as the direct component coefficient, the reverberant component is moved to a later sample number. When each filter coefficient is finally determined, normalization is performed with the maximum value of each reverberant component coefficient, so as to adjust each filter coefficient.

As described above, the signal processing control unit 260 of this embodiment sets the reverberant component coefficients and the direct component coefficient with respect to the respective reverberant components having the delay amounts for the respective unit signals finally determined, as the filter coefficients, in the respective filters in the filtering unit 250. Although the filter coefficients are calculated with the reverberant coefficients to be planarily (two-dimensionally) amplified in the above described filter coefficient calculating operation, it is also possible to calculate the filter coefficients with sterically (three-dimensionally) generated reverberant coefficients.

Figure 9:
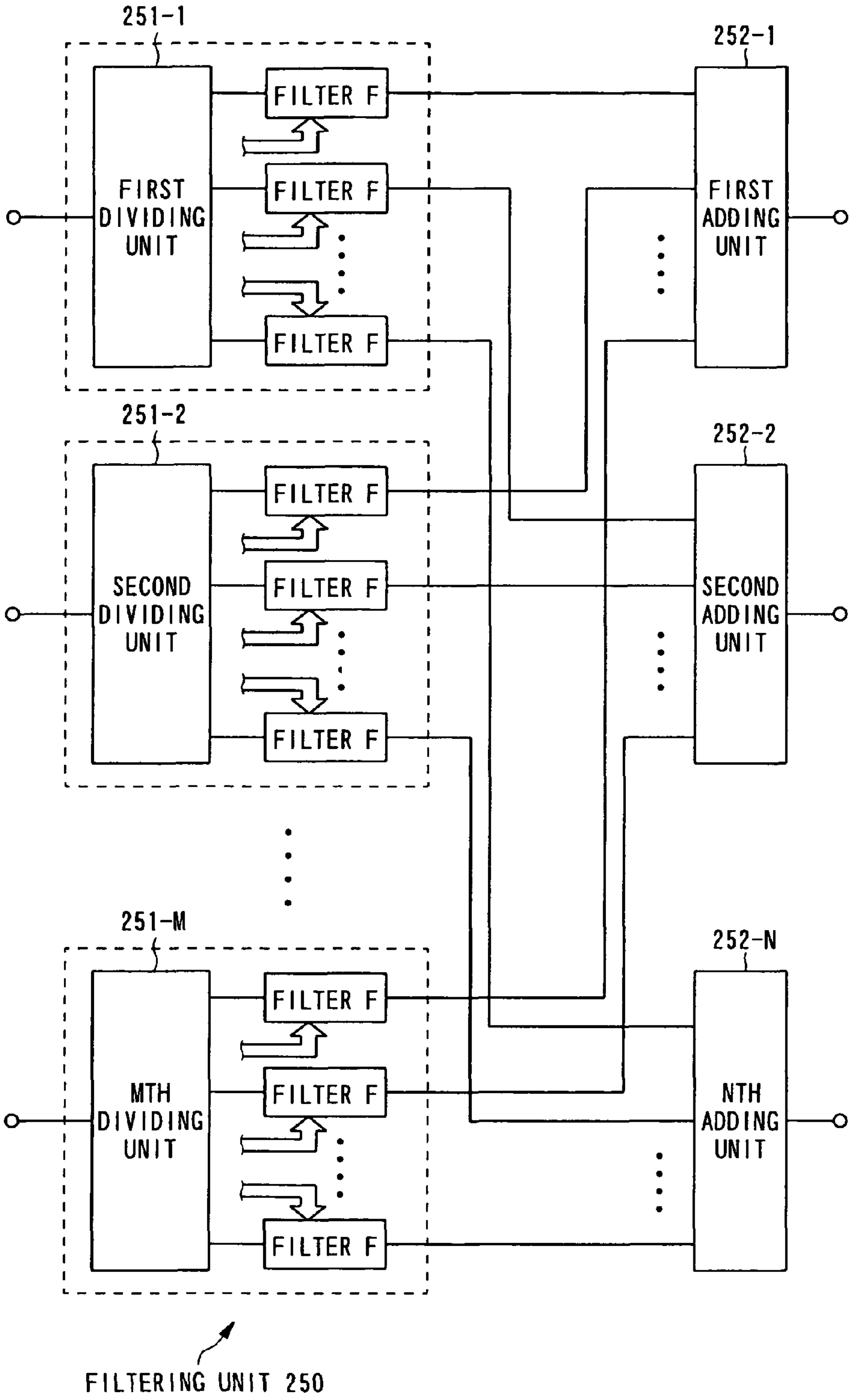
FIG. 9 is a block diagram showing the configuration of the filtering unit of the first embodiment.
Figure 10:
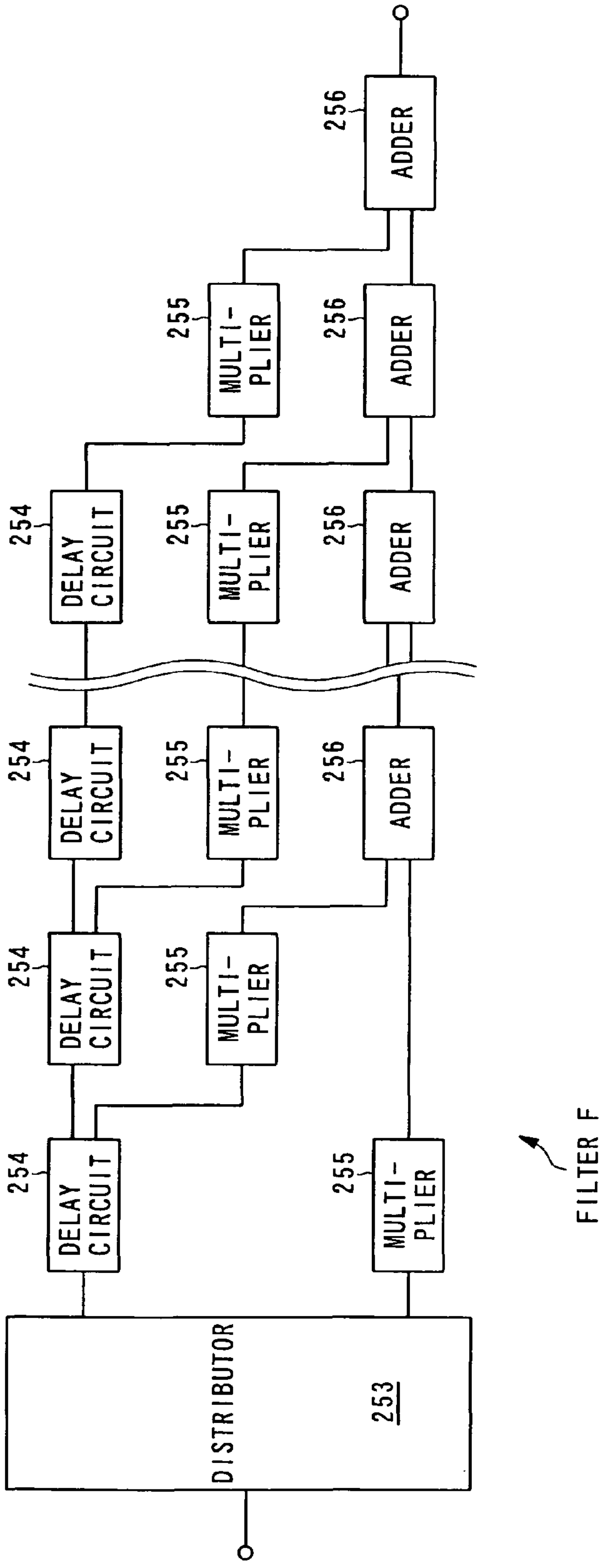
FIG. 10 is a block diagram showing the configuration of each filter in the filtering unit of the first embodiment.

Referring now to FIGS. 9 and 10, the configuration and operations of the filtering unit 250 of this embodiment are described. FIG. 9 is a block diagram showing the configuration of the filtering unit 250 of the signal processing unit 200 of this embodiment. FIG. 10 is a block diagram showing the configuration of each filter in the filtering unit 250.

As described above, the filtering unit 250 divides each audio signal or test signal input for each channel, performs filtering on each of the divided unit signals, and adds up the each unit signals subjected to the filtering. The filtering unit 250 then outputs the sum of the unit signals to each corresponding one of the D-A converters 122.

More specifically, the filtering unit 250 includes: dividing units 251 that divide each audio signal input for each channel by the same number as the number of speaker units SPU so as to obtain the unit signals; a plurality of filters F that perform filtering based on the filter coefficients that are set for the respective divided unit signals; and adding units 252 that add up each of the filtered unit signals for each of the speaker units SPU of the array speaker system 20.

As shown in FIG. 9, each of the dividing units 251 for the respective channels are named as a first dividing unit 251-1 through an Mth dividing unit 251-M, and each of the adding units 252 for the respective speaker units SPU are named as a first adding unit 252-1 through an Nth adding unit 252-*n*.

An audio signal or test signal for each corresponding channel is input to each of the dividing units 251 such as the first dividing unit. Each of the dividing units 251 divides the input audio signal or test signal into unit signals for each of the speaker units SPU, and outputs each of the divided unit signals to the filter F provided for each unit signals.

As described above, the filter coefficients determined by the signal processing control unit 260 are set in each of the filters F. Based on each of the set filter coefficients, each of the filters F adjusts each of the input unit signals that is the direct component, and performs filtering to control the direction components when the reverberant components are generated and control the directivity of the generated reverberant components are amplified through the array speaker system 20.

In this embodiment, for example, each filter F is formed with a FIR (Finite Impulse Response) filter F, as shown in FIG. 9. Each filter F convolutes the input unit signals, based on each of the set filter coefficients, and outputs the convoluted unit signals to the corresponding one of the speaker units SPU via the corresponding one of the D-A converters 122 and the corresponding one of the power amplifiers 123.

More specifically, each filter F includes a distributor 253 that distributes each unit signal to two identical components (hereinafter referred to simply as "signal components"), a plurality of delay circuits 254 and multipliers 255 for generating reverberant components based on one signal component, and a plurality of adders 256 that add the generated reverberant components successively to each input unit signal.

Each of the filters F has the same number of delay circuits 254 and the same number of multipliers 255 as the reverberant components to be amplified through the array speaker system 20, and also has the same number of adders 256 as the signal components that are delayed by the respective delay circuits 254 and are added.

In each of the delay circuits 254, the delay amount of each filter coefficient calculated by the signal processing control unit 260 is set. Each of the delay circuits 254 delays one signal component that is input based on the delay amount of the filter coefficient, and divides and outputs the delayed signal component to the multipliers 255 and the other delay circuits 254.

In each of the multipliers 255, the amplitude value of each of the filter coefficient set in the corresponding one of the delay circuits 254 is set. Based on the set amplitude value of each reverberant component, the signal component that is output from the corresponding one of the delay circuits 254, which is the delay circuit 254 placed in the stage immediately before the subject multiplier 255, is input to the subject multiplier 255. The multiplier 255 then multiplies the input signal component by the set amplitude value, and outputs the multiplication result to the corresponding one of the adders 256, which is the adder 256 placed in the stage immediately after the subject multiplier 255.

Meanwhile, in each of the adding units 252 such as the first adding unit, one unit signal subjected to filtering is input for each channel. Each of the adding units 252 adds up all the unit signals, and outputs the added unit signals to each of the D-A converters 122.

In this embodiment, each generated delay component is added to each unit signal in the filters F, and each of the unit signals are added up for each speaker unit SPU by each of the adding units 252. Before output to the D-A converters 122, the unit signals are normalized, that is, adjusted by the filters and other parts, so that the component forming each unit signal does not exceed "1".

As described so far, according to this embodiment, the surround-sound system 100 of this embodiment includes: the array speaker system 20 that has a plurality of speaker units SPU secured in predetermined arrangement positions; and the signal processing apparatus 120 that has the input processing unit 121 for retrieving each audio signal or test signal, drives each of the speaker units SPU, and amplifies the retrieved audio signal or test signal in the listening room 10 through the array speaker system 20. The signal processing apparatus 120 includes: the filtering unit 250 that divides the retrieved audio signal or test signal into a plurality of unit signals, performs signal processing on each of the divided unit signals based on the preset reverberant characteristics and the arrangement position of each of the speaker units SPU in the array speaker system 20, and generates and adds reverberant components to the divided unit signals; and the power amplifiers 123 that output the unit signals subjected to the signal processing to the respective speaker units SPU, and drive the array speaker system 20. When generating the reverberant components, the filtering unit 250 performs signal processing on each of the divided unit signals, so as to generate the reverberant components, which have controlled directivities, when output from the array speaker system 20.

With this configuration, the surround-sound system 100 of this embodiment divides each retrieved audio signal or test signal into a plurality of unit signals, and, when generating reverberant components for the divided unit signals, performs signal processing on each of the divided unit signals, so as to generate the reverberant components, which have controlled directivities when output from the array speaker system 20.

Accordingly, in a case where an audio signal or test signal is amplified in the array speaker system 20, the directivity of each reverberant component to be generated can be controlled. Thus, reverberant components that have desired directivities, as well as a direct component that is an input audio signal or test signal, can be amplified.

In this manner, without a speaker provided in the arrival direction of each reverberant component with respect to the listening position, it is possible to amplify each reverberant component in the arrival direction through a virtual speaker. Furthermore, since there is no need for installing and setting speakers, users can have high realistic sensations, without having to do a troublesome task.

Also, when generating a reverberant component, the filtering unit 250 of the surround-sound system 100 of this embodiment performs signal processing by controlling the delay amount of the reverberant component for each of the divided unit signals, so as to generate the reverberant component, which has a controlled directivity when output from the array speaker system 20.

In the surround-sound system 100 of this embodiment with the above configuration, when a reverberant component is generated, the delay amount of the reverberant component can be controlled for each of the divided unit signals, so as to generate the reverberant component, which has a controlled directivity, when output from the array speaker system 20. Accordingly, without a speaker provided in the arrival direction of each reverberant component with respect to the listening position, it is possible to amplify each reverberant component in the arrival direction through a virtual speaker, as described above. Furthermore, since there is no need for installing and setting speakers, users can have high realistic sensations, without having to do a troublesome task.

Also, when generating a reverberant component based on the characteristics of the respective speaker units SPU of the array speaker system 20 as well as the preset reverberant characteristics and the positions of the respective speaker units SPU, the filtering unit 250 of the surround-sound system 100 of this embodiment performs signal processing on each of the divided unit signals, so as to generate the reverberant component, which has a controlled directivity when output from the array speaker system 20.

In the surround-sound system 100 of this embodiment with the above configuration, when a reverberant component is generated, signal processing is performed on each of the divided unit signals, so that the reverberant component, which has a controlled directivity when output from the array speaker system 20 can be generated based on the characteristics of the respective speaker units SPU.

In this manner, reverberant components, which have controlled directivities when output from the array speaker system 20, can be generated based on the characteristics of the respective speaker units SPU. Accordingly, without a speaker provided in the arrival direction of each reverberant component with respect to the listening position, it is possible to amplify each reverberant component in the arrival direction through a virtual speaker, as described above. Furthermore, since there is no need for installing and setting speakers, users can have high realistic sensations, without having to do a troublesome task.

Also, in the surround-sound system 100 of this embodiment, the array speaker system 20 is formed with the speaker units SPU having the same characteristics. When generating reverberant components, the filtering unit 250 performs signal processing on each of the divided units signals, so as to control the directivity of each of the reverberant components when the reverberant component is output from the array speaker system 20. Also, the filtering unit 250 is formed with FIR (Finite Impulse Response) filters, and performs signal processing on each of the unit signals, based on the filter coefficients of the FIR filters.

In the surround-sound system 100 of this embodiment with the above configuration, it is possible to amplify each reverberant component in the arrival direction through a virtual speaker, without a speaker provided in the arrival direction of each reverberant component with respect to the listening position, as described above. Furthermore, since there is no need for installing and setting speakers, users can have high realistic sensations, without having to do a troublesome task.

In this embodiment, the signal processing control unit 260 calculates the focal coordinates for each reverberant component, based on the reference distance representing the focal angle and distance of each reverberant component. However, the focal coordinates may be directly input and set.

In this embodiment, the signal processing control unit 260 also calculates the delay amount for controlling the directivity of each reverberant component for each unit signal, based on the focal coordinates of the reverberant component. However, the delay amount for controlling the directivity of each reverberant component may be calculated for each unit signal, based on the tilt of the sound wave front in the direction for setting the directivity.

Figure 11:
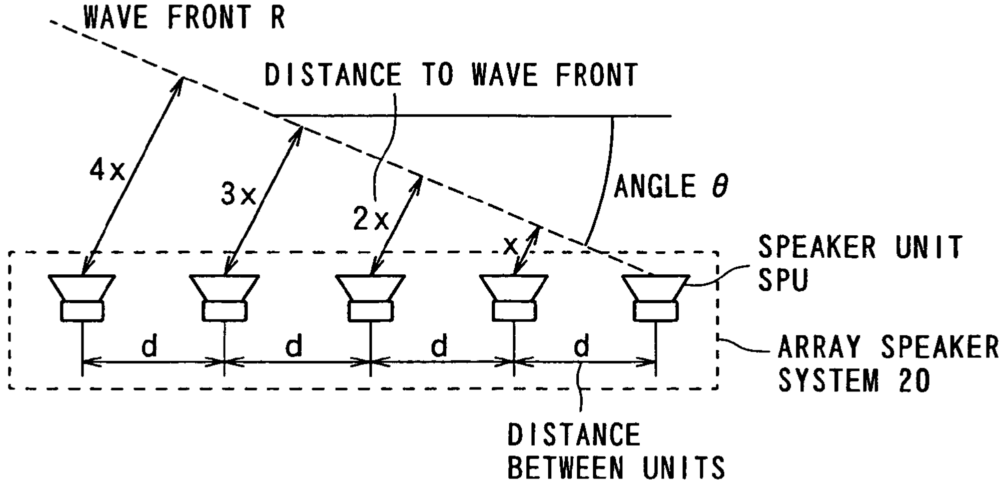
FIG. 11 is a diagram for describing another example operation to be performed by the signal processing control unit of the first embodiment to calculate the filter coefficients.

In such a case, for example, the signal processing control unit 260 may obtain the angle of the sound wave front R indicating the direction of each reverberant component to be amplified in the listening room 10, as shown in FIG. 11. The signal processing control unit 260 may then calculate the distance x between the wave front and each speaker unit SPU (hereinafter referred to as the wave-front distance x) based on the angle of the wave front and the distance d between the speaker units (hereinafter referred to as the distance d). Based on each calculated wave-front distance x, the signal processing control unit 260 may calculate the delay amount for controlling the directivity of each reverberant component for each unit signal.

Also, in this embodiment, the filter coefficients for all reverberant components are calculated, and the reverberant components are controlled independently of one another. However, it is also possible to collectively control the directivities of reverberant components that are generated after the generation of initial reverberant components of secondary reflections or the likes.

For example, the directivities of later reverberant components may be controlled in the following manner:

(1) the directivities of the later reverberant components are diversified by setting the focal point behind the array speaker system 20; and (2) the direction of setting the directivities is not set in the direction of the listening position, and the focal angle is set at such an angle that the low-order reverberant components among the later reverberant components do not reach the listening position.

In this case, the directivities of the later reverberant components can be more easily controlled than in a case where the reverberant components are controlled independently of one another as described above. Accordingly, the process load imposed on the signal processing control unit 260 calculating each filter coefficient can be reduced.

Also, in this embodiment, the 5.1 ch surround-sound system 100 is used for setting the reverberation times. However, this embodiment may be applied to other sound reproducing apparatuses such as a 7.1 ch surround-sound system and a stereo-sound reproducing apparatus involving an AV amplifier or the like.

Also, in this embodiment, the signal processing apparatus 120 performs signal processing such as the addition of reverberant components based on digital signals output from the sound-source output apparatus 110. However, the signal processing apparatus 120 may perform signal processing, based on analog signals that are output from the sound-source output apparatus 110 or analog signals that are input from the outside.

Also, in this embodiment, the array speaker system 20 is formed with the speaker units SPU that have the same characteristics and are arranged at predetermined intervals. However, the array speaker system 130 may be formed with speaker units SPU that have different characteristics from one another and are arranged at predetermined intervals.

In such a case, the signal processing control unit 260 calculates the reverberation control coefficients, based only on the predetermined intervals, or based on the predetermined intervals and the characteristics of each of the speaker units SPU.

Also, in this embodiment, the filtering unit 250 divides each audio signal into the same number of unit signals as the number of speaker units SPU, and then performs filtering for each unit signal. However, each predetermined number of speaker units SPU may form a speaker unit group, and the filtering unit 250 may divide each audio signal into the same number of unit signals as the number of speaker unit group and then perform filtering processing for each of the unit signals.

In such a case, each unit signal is input for each speaker unit group in the array speaker system 130. Accordingly, the array speaker unit 130 amplifies reverberant components including a direct component having the directivities controlled.

Second Embodiment

Figure 12:
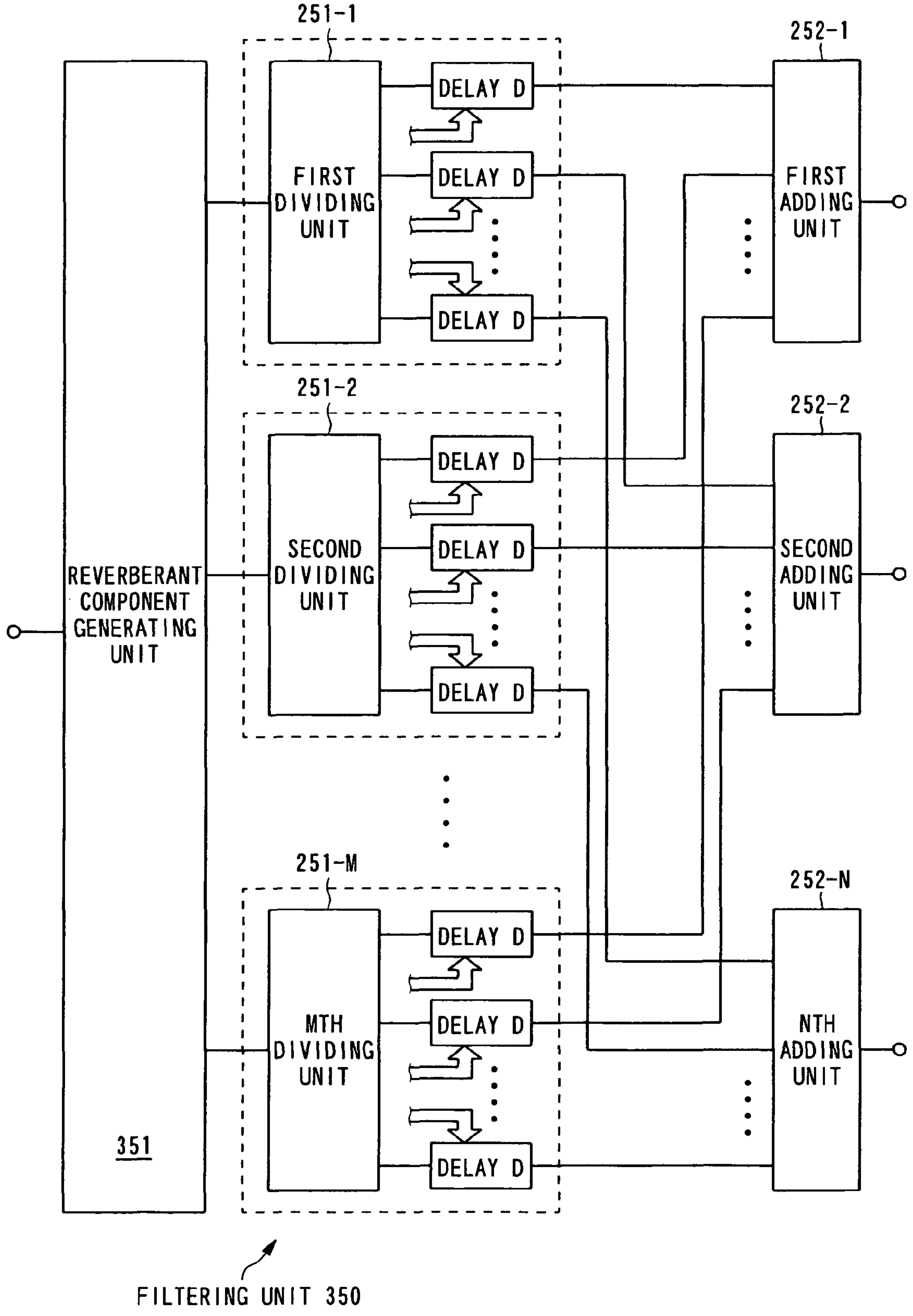
FIG. 12 is a block diagram showing the configuration of the filtering unit of a second embodiment.

Referring now to FIG. 12, a second embodiment of a surround-sound system according to the present invention is described.

The configuration of this embodiment is characterized in that the directivity of a reverberant component is controlled by controlling the delay amount for each unit signal after the generation of the reverberant component, while in the first embodiment, a reverberant component is generated so that its directivity is controlled, based on a filter coefficient for each unit signal. The other aspects of this configuration are the same as those of the first embodiment. Therefore, the other parts are denoted by the same reference numerals as those of the first embodiment, and explanation of them is not repeated herein.

First, a filtering unit of this embodiment is described with reference to FIG. 12. FIG. 12 is a block diagram showing the configuration of the filtering unit of this embodiment.

As the filtering unit of the first embodiment, the filtering unit 350 of this embodiment is provided for each channel. As shown in FIG. 12, the filtering unit 350 includes: a reverberant component generating unit 351 that generates reverberant components, while maintaining a direct component, based on each audio signal or test signal input for each channel and coefficients (hereinafter referred to as the reverberation control coefficients) calculated by the signal processing control unit 260; dividing units 251 that divide each of the reverberant components and direct component by the same number as the number of speaker units SPU, so as to obtain unit signals; delays D that perform delaying based on each delay control coefficient predetermined for performing delay control for each of the divided unit signals; and adding units 252 that add up the delayed unit signals for each of the speaker units SPU of the array speaker system 20.

FIG. 12 shows a block diagram of the filtering unit 350 used in a case where the reverberant component generating unit 351 is to generate M−1 reverberant components. This reverberant component generating unit 351 controls the directivities of a direct component and reverberant components by delaying M components including the direct component. In FIG. 12, the dividing units 251 for each channel are shown as a first dividing unit 251-1 through an Mth dividing unit 251-M, and the adding units 252 for each of the speaker units SPU are shown as a first adding unit 252-1 through an Nth adding unit 252-N.

Each audio signal or test signal for each channel is input to the reverberant component generating unit 351. The reverberant component generating unit 351 generates reverberant components based on the reverberation control coefficients calculated based on reverberant parameters by the signal processing control unit 260, while maintaining a direct component that is an input signal. The reverberant component generating unit 351 then outputs the direct component and the reverberant components to each of the dividing units 251.

A direct component or reverberant components for each channel are input to each of the dividing units 251 such as the first dividing unit 251-1. Each of the dividing units 251 divides each of the direct component and reverberant components input for each channel into unit signals, and outputs each of the divided unit signals to the delay D provided for each of the unit signals.

The delay control coefficients that are determined beforehand by the signal processing control unit 260 are set in each of the delays D. Based on each of the set delay control coefficients, each of the delays D adds a predetermined delay amount to an input direct component or reverberant component, so that a desired directivity can be set when the direct component or reverberant component is amplified through the array speaker system 20. Each of the delays D then outputs the added direct component or reverberant component to the corresponding one of the adders 252.

In this embodiment, based on the reverberant parameters calculated by the reverberant characteristics analyzing unit 127C, the signal processing control unit 260 calculates each coefficient for the reverberant component generating unit 351 to generate a reverberant component, and sets the coefficient in the reverberant component generating unit 351. Based on the directivity data calculated by the reverberant characteristics analyzing unit 127C with respect to each reverberant component, the signal processing control unit 260 calculates each delay control coefficient for setting a delay amount of each of a direct component and reverberant components generated by the reverberant component generating unit for each unit signal, and sets the delay control coefficient in the corresponding one of the delays D.

As described so far, according to this embodiment, similarly to the first embodiment, the surround-sound system 100 of this embodiment includes: the array speaker system 20 that has a plurality of speaker units SPU secured in predetermined arrangement positions; and the signal processing apparatus 120 that has the input processing unit 121 that retrieve each audio signal or test signal, drives each of the speaker units SPU, and amplifies the audio signal or test signal in the listening room 10 through the array speaker system 20. The signal processing apparatus 120 includes: the filtering unit 350 that divides the retrieved audio signal or test signal into unit signals, performs signal processing on each of the divided unit signals based on the preset reverberant characteristics and the arrangement position of each of the speaker units SPU in the array speaker system 20, and generates and adds reverberant components to the divided unit signals; and the power amplifiers 123 that output the unit signals subjected to the signal processing to the respective speaker units SPU, and drive the array speaker system 20. When generating the reverberant components, the filtering unit 350 performs signal processing on each of the divided unit signals, so as to generate the reverberant components that have directivities, when output from the array speaker system 20, is controlled.

In this embodiment, the 5.1 ch surround-sound system 100 is used for setting the reverberation times. However, this embodiment may be applied to other sound reproducing apparatuses such as a 7.1 ch surround-sound system and a stereo-sound reproducing apparatus involving an AV amplifier or the like.

Also, in this embodiment, the signal processing apparatus 120 performs signal processing such as the addition of reverberant components based on digital signals output from the sound-source output apparatus 110. However, the signal processing apparatus 120 may perform signal processing, based on analog signals that are output from the sound-source output apparatus 110 or analog signals that are input from the outside.

The invention claimed is:

1. A sound reproducing system comprising:

an array speaker having a plurality of speaker units secured in predetermined arrangement positions; and a sound reproducing apparatus that includes a retrieving unit that retrieves a sound signal, and drives each of the speaker units and causes the array speaker to amplify the retrieved sound signal in a sound space, wherein the sound reproducing apparatus comprises:

a dividing unit that divides the retrieved sound signal by the same number as the number of speaker unit group formed with a predetermined number of speaker units, so as to obtain unit signals;

a signal processing unit that performs signal processing on each of the divided unit signals; and a driving unit that outputs the unit signals subjected to the signal processing to the respective speaker units, so as to drive the array speaker, wherein the sound reproducing apparatus further comprises:

a collecting unit that collects input test signals, a reverberant characteristics analyzing unit including an analyzing part that analyzes reverberant characteristics based on the input test signals collected by the collecting unit, and a calculating part that compares the results of the analyzed reverberant characteristics with pre-stored target reverberant characteristics, and calculates a reverberant parameter, and wherein, by generating and adding reverberant components to the divided unit signals based on the reverberant parameter calculated by the calculating part of the reverberant characteristics unit, the signal processing unit performs the signal processing on each of the divided unit signals, so as to generate the reverberant components that have directivities, when the reverberant components are output from the array speaker, controlled.

2. The sound reproducing system according to claim 1, wherein the signal processing unit performs, when generating the reverberant components, the signal processing by controlling delay amounts of the reverberant components for the respective divided unit signals, so as to generate the reverberant components that have the directivities, when output from the array speaker, controlled.

3. The sound reproducing system according to claim 1, wherein the signal processing unit performs, when generating the reverberant components, the signal processing on the respective unit signals, so as to generate the reverberant components that have the directivities, when output from the array speaker, controlled based not only on the preset reverberant characteristics and the position of each of the divided speaker units in the array speaker but also on the characteristics of each of the speaker units.

4. The sound reproducing system according to claim 1, wherein the array speaker is formed with the speaker units having the same characteristics.

5. The sound reproducing system according to claim 1, wherein the signal processing unit, when generating the reverberant components, performs the signal processing on each of the divided unit signals, so as to control the directivity when output from the array speaker for each of the reverberant components.

6. The sound reproducing system according to claim 1, wherein the signal processing unit is formed with a FIR (Finite Impulse Response) filter, and performs the signal processing on each of the unit signals based on a filter coefficient of the FIR filter.

7. The sound reproducing system according to claim 1, wherein, when the speaker unit group is formed with one speaker unit, the dividing unit performs the dividing by the same number as the number of speaker.

8. A sound reproducing apparatus that amplifies a sound signal through an array speaker having a plurality of speaker units secured in predetermined arrangement positions, comprising:

a retrieving unit that retrieves the sound signal;

a dividing unit that divides the retrieved sound signal by the same number as the number of speaker unit group that is formed with a predetermined number of speaker units, so as to obtain unit signals;

a signal processing unit that performs signal processing on each of the divided unit signals; and a driving unit that outputs the unit signals subjected to the signal processing to the respective speaker units, so as to drive the array speaker, wherein the sound reproducing apparatus further comprises:

a collecting unit that collects input test signals, a reverberant characteristics analyzing unit including an analyzing part that analyzes reverberant characteristics based on the input test signals collected by the collecting unit, and a calculating part that compares the results of the analyzed reverberant characteristics with pre-stored target reverberant characteristics, and calculates a reverberant parameter, and wherein, by generating and adding reverberant components to the divided unit signals based on the reverberant parameter calculated by the calculating part of the reverberant characteristics unit, the signal processing unit performs the signal processing on each of the divided unit signals, so as to generate the reverberant components that have directivities, when output from the array speaker, controlled.

* * * * *